United States Patent
Schmitt et al.

(10) Patent No.: US 11,422,777 B2
(45) Date of Patent: Aug. 23, 2022

(54) SYSTEM AND METHODS WITH REDUCED COMPLEXITY IN THE INTEGRATION OF EXPOSED INFORMATION MODELS WITH APPLICATIONS

(71) Applicant: ABB Schweiz AG, Baden (CH)

(72) Inventors: Johannes O. Schmitt, Ladenburg (DE); Sten Gruener, Ilvesheim (DE); Somayeh Malakuti, Dossenheim (DE); Roland Braun, Niederkassel Luelsdorf (DE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/105,656

(22) Filed: Nov. 27, 2020

(65) Prior Publication Data
US 2021/0081181 A1 Mar. 18, 2021

Related U.S. Application Data

(63) Continuation of application No. PCT/EP2019/064953, filed on Jun. 7, 2019.

(30) Foreign Application Priority Data

Jun. 11, 2018 (EP) .................................... 18177123

(51) Int. Cl.
 *G06F 9/44* (2018.01)
 *G06F 8/35* (2018.01)
 (Continued)

(52) U.S. Cl.
 CPC .................. *G06F 8/35* (2013.01); *G06F 8/24* (2013.01); *G06F 8/458* (2013.01); *G06F 8/71* (2013.01)

(58) Field of Classification Search
 CPC ........................................................ G06F 8/35
 (Continued)

(56) References Cited

U.S. PATENT DOCUMENTS

| | | | | |
|---|---|---|---|---|
| 7,693,586 B2 * | 4/2010 | Dumas | ................... | G06F 9/541 700/32 |
| 7,941,461 B2 * | 5/2011 | Chang | ................... | G06F 16/88 707/803 |

(Continued)

FOREIGN PATENT DOCUMENTS

EP 1988672 A1 * 11/2008 ......... H04L 12/2803

OTHER PUBLICATIONS

J. Schmitt, S. Grüner and R. Braun, "Reducing integration effort for cyber-physical systems through integrated information modelling using annotated application code," 2018 14th IEEE International Workshop on Factory Communication Systems (WFCS), 2018, pp. 1-9, doi: 10.1109/WFCS.2018.8402363.*

(Continued)

*Primary Examiner* — Francisco J Aponte
(74) *Attorney, Agent, or Firm* — Leydig, Voit & Mayer, Ltd.

(57) ABSTRACT

A computer system for automated model integration of an information model with a corresponding application includes: an information model server for exposing an information model to a consumer, the exposed information model including model-elements for exposing types or classes, and for exposing instances of types or classes and their member-values; an application component for providing application code augmented with mapping descriptions defining how an internal information model of the application is mapped to the exposed information model; and a model integration component that: registers internal information model-elements to be exposed; maps the registered (Continued)

internal information model-elements to exposed information model-elements in accordance with the mapping descriptions; and updates an information model-element by: detecting a change of an internal or exposed information model-element; determining a synchronization direction; and performing match-making to determine a model-element corresponding to the changed model-element by using signatures of the corresponding information model-elements.

16 Claims, 10 Drawing Sheets

(51) Int. Cl.
*G06F 8/20* (2018.01)
*G06F 8/41* (2018.01)
*G06F 8/71* (2018.01)

(58) Field of Classification Search
USPC .......................................................... 717/107
See application file for complete search history.

(56) References Cited

U.S. PATENT DOCUMENTS

| | | | | |
|---|---|---|---|---|
| 8,001,519 | B2* | 8/2011 | Conallen | G06F 8/316 717/105 |
| 8,234,630 | B2* | 7/2012 | Raghavan | G06F 8/34 717/125 |
| 8,621,428 | B2* | 12/2013 | Massoudi | G06F 8/31 717/106 |
| 8,707,261 | B2* | 4/2014 | Heller | G06F 8/10 717/121 |
| 8,789,009 | B2* | 7/2014 | Lee | G06F 8/35 717/104 |
| 8,825,458 | B2* | 9/2014 | Bumbalough | G06F 30/13 703/6 |
| 8,869,098 | B2* | 10/2014 | Elaasar | G06F 8/10 717/104 |
| 9,536,023 | B2* | 1/2017 | Englehart | G06F 9/541 |
| 9,762,435 | B2* | 9/2017 | Shelton | G06F 1/206 |
| 9,946,989 | B2* | 4/2018 | Bhola | G06Q 10/107 |
| 10,095,488 | B2* | 10/2018 | Ebner | G06F 16/00 |
| 10,255,051 | B2* | 4/2019 | Kulkarni | G06Q 10/067 |
| 10,503,784 | B1* | 12/2019 | Dean | H04L 67/10 |
| 10,564,622 | B1* | 2/2020 | Dean | G06F 16/9017 |
| 11,093,222 | B2* | 8/2021 | Klemenz | G06F 8/38 |
| 11,244,090 | B2* | 2/2022 | Szpak | G06F 30/18 |
| 2008/0126027 | A1* | 5/2008 | Altenhofen | G06F 8/10 703/2 |
| 2010/0083212 | A1* | 4/2010 | Fritzsche | G06F 8/34 717/104 |
| 2010/0162225 | A1* | 6/2010 | Huang | G06F 8/72 717/171 |
| 2013/0297528 | A1* | 11/2013 | Stiehl | G06Q 10/06 705/348 |
| 2015/0100942 | A1* | 4/2015 | Misbhauddin | G06F 8/72 717/104 |
| 2016/0139886 | A1* | 5/2016 | Perdriau | G06F 16/88 717/104 |
| 2016/0179474 | A1* | 6/2016 | Pana | G06Q 10/067 705/348 |
| 2017/0046235 | A1* | 2/2017 | Straub | G06F 8/35 |
| 2017/0048339 | A1* | 2/2017 | Straub | G06F 8/40 |
| 2018/0024814 | A1* | 1/2018 | Ouali | G06F 11/3688 717/105 |
| 2018/0113647 | A1* | 4/2018 | Palareddy | G06F 9/44505 |
| 2018/0314534 | A1* | 11/2018 | Jahanbanifar | G06F 8/71 |
| 2018/0364685 | A1* | 12/2018 | Sprenger | G05B 23/0264 |
| 2019/0102162 | A1* | 4/2019 | Pitre | H04L 63/10 |
| 2019/0188006 | A1* | 6/2019 | Ritter | G06F 8/38 |
| 2020/0125956 | A1* | 4/2020 | Ravi | G06K 9/6256 |
| 2021/0117548 | A1* | 4/2021 | Gokhman | G06F 8/71 |
| 2021/0240449 | A1* | 8/2021 | Oara | G06F 8/22 |
| 2022/0019428 | A1* | 1/2022 | Rubio | G06F 8/315 |

OTHER PUBLICATIONS

A. Brusaferri, A. Ballarino, F. A. Cavadini, D. Manzocchi and M. Mazzolini, "CPS-based hierarchical and self-similar automation architecture for the control and verification of reconfigurable manufacturing systems," Proceedings of the 2014 IEEE Emerging Technology and Factory Automation (ETFA), 2014, pp. 1-8.*
Shin, I.-J.; Song, B.-K.; Eom, D.-S. Auto-Mapping and Configuration Method of IEC 61850 Information Model Based on OPC UA. Energies 2016, 9, 901.*
Jan Reitz et al. "Automatic Integration of Simulated Systems into OPC UA Networks"; Institute for Man-Machine-Interaction, RWTH Aachen University Aachen, Germany—2020 16th IEEE International Conference on Automation Science and Engineering (CASE) Aug. 20-21, 2020.*
Markus Graube et al. "Information Models in OPC UA and their Advantages and Disadvantages"; Technische Universitat Dresden Germany—2017 IEEE.*
D. Schulz et al: "Behind the façade: Efficient Software Development with OPC UA", 2015 IEEE 20th Conference on Emerging Technologies & Factory Automation (ETFA), Sep. 2015, pp. 1-8, IEEE, Luxemburg.
F. Palm et al: "Open source as enabler for OPC UA in industrial automation", 2015 IEEE 20th Conference on Emerging Technologies & Factory Automation (ETFA), Sep. 8, 2015, pp. 1-6, XP032797486, IEEE, Luxemburg.
OPC Foundation: "OPC Unified Architecture Specification Part 1: Overview and Concepts, Release 1.01", Feb. 5, 2009, pp. 1-28, XP002630848, OPC Foundation, USA.

* cited by examiner

310

| Annotation-Mechanism | Example Annotation | Rationale |
|---|---|---|
| Class-Marker | @Node | Indicator that instances of this class shall be synchronized to the exposed information model. Additional parameters can be used on this level to defined exposed-model-specific elements e.g. to set a OPC UA Nodeto a Variable-Node |
| Address, References | @Reference | These annotations indicate the synchronizer to perform a match-making between the structures of the internal and exposed model and to update the content of the fields of the internal model or the references of the exposed model accordingly. |
| Identity | @ID | Internal and external objects have to be identified in order to find corresponding objects. This annotation can be used to predefine the used ID or to provide the automatic assigned ID to the application. |
| Properties | @Reference<br><br>@Value | Expose fields of objects as sub-objects (Sub-Nodes). If a node is considered to be a (UA) Variable, it can expose a field as "Value" of this (variable-)node. |
| Methods | @Method | Expose methods to embedded logic |
| Additional Attributes | @BrowseName<br>@DisplayName<br>@Description<br>@DataType | Such annotations can be used on fields to use their values to fill the meta data of the exposed object (node) |

| Example Code | Description |
| --- | --- |
| @Node | @Node: Represent this object in model |
| public class FiniteStateMachineType extends StateMachineType implements EventHandler { | Inheritance (optional): import elements/aspects from parent<br>EventHandler (optional): Interface used for callbacks from model |
| @BrowseName @DisplayName<br>public String name; | @BrowseName, @DisplayName: Meta-Data (like name/id) of node/reference can be synced with field |
| @Reference (import=false)<br>public StateMachineVariableType currentState; | @Reference: Create Node and Reference to contained value, limiting synchronization direction from exposed model to internal model only |
| @Reference<br>public ArrayList<StateMachineVariableType> states | @Reference: Content of collections is processed as individual objects |
| private boolean subscribedToCurrentState=false; | (normal field/methods: Non-annotated elements are not exposed to model) |
| @Method<br>public void checkState(StateMachineVariableType state ) {...} | @Method: Annotated method is exposed in model |
| public handle(Event event) {...}<br>...<br>} | EventHandler: Integrate business logic – e.g. StateMachine transition handling |

FIG. 3B

SYSTEM AND METHODS WITH REDUCED COMPLEXITY IN THE INTEGRATION OF EXPOSED INFORMATION MODELS WITH APPLICATIONS

CROSS-REFERENCE TO PRIOR APPLICATION

This application is a continuation of International Patent Application No. PCT/EP2019/064953, filed on Jun. 7, 2019, which claims priority to European Patent Application No. EP 18177123.9, filed on Jun. 11, 2018. The entire disclosure of both applications is hereby incorporated by reference herein.

FIELD

The present invention generally relates to application integration with information models and more particularly to synchronizing internal information models (data models) of applications with exposed information models.

BACKGROUND

Currently the integration of an application (on a device) with an information model (e.g. an OPC Unified Architecture (UA) model) that is exposed on a network is a manual task. Such a manual task is error prone because information models of modern applications can become very complex and the respective elements of the application data model often have cryptic names making it difficult for human users to implement a correctly working configuration for integration. Further, changes in the application have to be manually transferred to changes in the information model at design time causing interruptions in the execution of the application.

Applications typically have an embedded data model, for example, defined as objects or data structures in a programming language. Such an embedded model is referred to as internal information model herein. A challenge is to map such existing internal information models to the corresponding exposed information models. An example for exposed information models are OPC UA-based information models as defined by IEC 62541-3, Edition 2.0, 2015-03, (OPC Unified Architecture—Part 3: Address Space Model) and IEC 62541-5, Edition 2.0, 2015-03, (OPC Unified Architecture—Part 5: Information Model), the Address Space equals instances of an exposed information model. The integration of the information model with the application is a complex task that typically requires large manual programming efforts and additional components to manage the interaction between applications and external exposed information models. Existing tools, SDKs or programming libraries offer means to define information models, but they lack a concept of how to migrate legacy data models defined within applications into an information model that can be exposed on the network (e.g. processed through OPC UA services). The existing manual integration-mechanisms are complex and error prone for humans because developers need to have a detailed knowledge of the targeted information modeling technology, the adopted SDKs, the conceptual mapping from application data models into the targeted information models, while preserving the semantic of the applications.

SUMMARY

In an embodiment, the present invention provides a computer system for automated model integration of an information model with a corresponding application, the system comprising: an information model server configured to expose an information model to a consumer, the exposed information model comprising model-elements for exposing types or classes, and for exposing instances of types or classes and their member-values; an application component configured to provide application code augmented with mapping descriptions defining how an internal information model of the application is mapped to the exposed information model; and a model integration component configured to: register internal information model-elements to be exposed; map the registered internal information model-elements to exposed information model-elements in accordance with the mapping descriptions; and update an information model-element by: detecting a change of an internal or exposed information model-element; determining a synchronization direction; performing match-making to determine a model-element corresponding to the changed model-element by using signatures of the corresponding information model-elements combined with the mapping description; and synchronizing, in accordance with the determined synchronization direction, the exposed information model-element and the corresponding internal information model-element.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 3A illustrates shows examples of application code annotations which can be used to define an information model;

FIG. 3B illustrates an application code example using annotated classes following the OPC UA Meta-Model;

DETAILED DESCRIPTION

Figure 1:
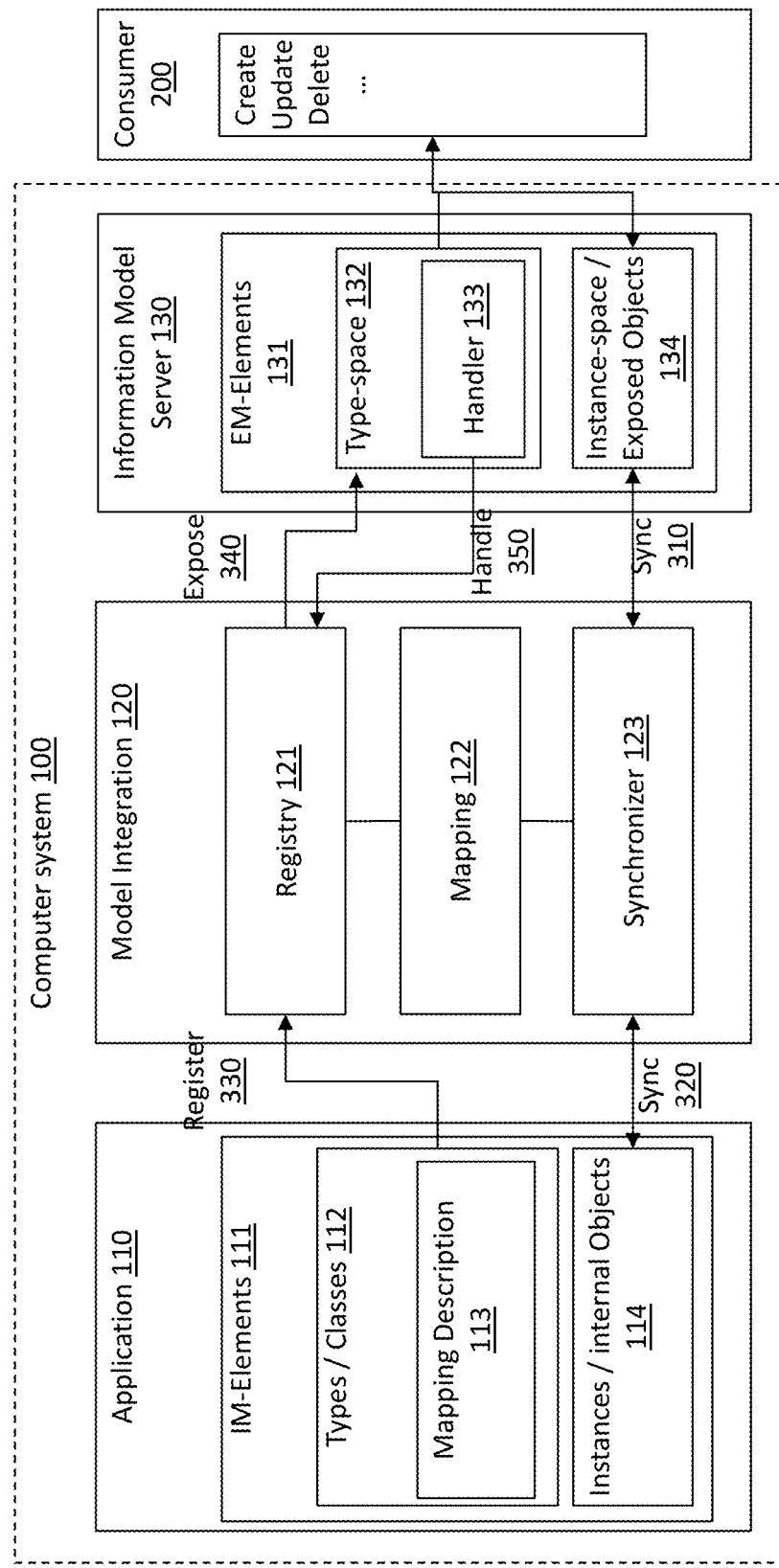
FIG. 1 is a block diagram of a computer system for automated model integration of an information model with a corresponding application according to an embodiment.

There is a need to provide systems and methods for improving flexibility in integration of exposed information models with internal information models of applications with reduced complexity to provide a more robust model integration approach.

The above technical problem is solved by a computer system, computer-implemented methods and computer program products with the features as described herein. The described embodiments allow for seamless integration of information modelling with the application eliminating the need for manual creation of integration code. The described approach provides for direct access to live values of the application elements at runtime. It further allows to introspect and modify information model structures during application runtime.

To solve this technical problem, the application code (e.g., the internal information model (data model) of the application) is augmented with mapping descriptions to enable automatic exposure of annotated types/classes in the exposed information model. The augmented code can be implemented via annotations including the mapping description directly in the code to reuse application code for constructing the exposed information model. Alternatively, mapping descriptions may be stored separately from the code (e.g., in XML files). The separately stored mapping descriptions can directly relate to the respective code portions. Annotations can be used like comments within the code to provide additional information that is required to integrate the code with the exposed information model. These annotations can be evaluated during runtime and combined with the information that is implicitly provided by the code. For example, class signatures (name, inheritance, interfaces), field signatures (name, type, value) and method signatures (name, input and output parameters) can be used to construct the exposed information model and to integrate the exposed information model with the code or internal information model. The integration of information modelling with application code can be based on mechanisms and concepts known from established technologies that make use of annotations, such as for example, Java Persistence API (JPA), Java Architecture for XML Binding (JAXB), or Java API for RESTful/XML Web Services (JAX-RS). The base concepts used for the annotations can be summarized as:

Class-Marker: Declare an element or a class to be relevant
Address: Relation of object within target context
Identity: Link object to entry
Reference: Correlate structures of exposed model elements (e.g. references) to structures of internal model elements (e.g. fields)

The exposed information model is self-contained in that it provides all meta data needed to process exposed information by a client/consumer. For example, a client/consumer can be another system interacting with the information model server, or it can be a human user interacting with the information model through an appropriate software application. This includes type declaration information. This also includes information about decoding and encoding of transferred serialized data. The exposed information model follows basically a graph pattern made from nodes and edges. The nodes and edges are always created based on predefined types (type safe model). Edges are represented through references to associate nodes.

Through the exposed information model, a client/consumer can browse the actual configuration of the application and then make use of types/classes that are represented in the exposed model to create instances in the exposed information model at application runtime. In other words, the client/consumer can interact with model elements via the exposed information model. These interaction elements have two primary purposes: firstly, allowing the client/consumer to change the application data model of the application, and secondly to let the client/consumer become aware of changes that occurred in the application. An automatic mapping of model and object-structures can be used to instantiate internal objects in the application accordingly, during runtime. This automatic mapping allows to synchronize the elements of the information models bi-directionally. In one embodiment, handlers on both sides can be used to handle requests and updates using additional business logic.

In one embodiment, a computer system is provided for automated model integration of an information model with a corresponding application. Model integration, as used herein, relates to model structure integration and/or to model content integration and occurs at application runtime. Model structure integration and model content integration is achieved by providing means which allow to synchronize between the exposed information model and the internal information model of the application model structure or content value changes that occur in any one of the information models. That is, changes occurring in the exposed information model will trigger updates in the corresponding internal information model and vice versa.

The computer system includes an information model server to expose an information model to a consumer. The information model server is a component enabling access to the exposed information model. The access functions implemented by the information model server may include services to browse the address space, to read and write attribute values, to create or delete references between model-elements, to get event notifications, and to create and delete exposed model-elements.

Within the field of software engineering and data modeling an information model is usually an abstract, formal representation of entity types that may include their properties, relationships and the operations that can be performed on them. The entity types in the model may be kinds of real-world objects, such as devices in a network, or occurrences, or they may themselves be abstract, such as for the entities used in a billing system. Typically, they are used to model a constrained domain that can be described by a closed set of entity types, properties, relationships and operations. An information model provides formalism to the description of a problem domain without constraining how that description is mapped to an actual implementation in software. There may be many mappings of the information model. Such mappings are typically called data models, irrespective of whether they are object models (e.g. using UML), entity relationship models or XML schemas. Application data models are also referred to as internal information models herein.

A plurality of information modeling languages exists including, but not limited to: the entity-relationship (ER) graphic notation, the Integrated Definition Language 1 Extended (IDEF1X), the EXPRESS language and the Unified Modeling Language (UML), the Object-Role Modeling language (ORM) and Fully Communication Oriented Information Modeling (FCO-IM). Some modeling languages refer to the term "type" whereas other languages use the term "class". For these reasons, types/classes of information model-elements are used synonymous herein. The exposed information model has exposed model-elements for exposing types to a consumer, and for exposing instances of types and their member-values. The exposed model-elements may have a type-space for exposing the types as part of the exposed information model, and may have an instance-space for exposing instances of types and their member-values.

An application component of the computer system provides application code augmented with mapping descriptions. Providing application code as used herein means to provide means for accessing the application code from outside the application component. The mapping descriptions define how an internal information model of the application is mapped to the exposed information model. For example, a particular mapping description can be configured to select one or more type definitions (classes) of the internal information model to be exposed in the type-space of the exposed information model.

A model integration component of the computer system registers internal information model-elements to be exposed. The model integration component can access the application code provided by the application component. The mapping descriptions in the augmented code are used to select the respective internal information model-elements which are the registered in a registry of the system. A mapping module of the integration component maps the registered internal information model-elements to corresponding exposed information model-elements in accordance with the mapping descriptions. The mapping module is configured to map the registered internal information model-elements by parsing fields and methods of respective internal information model types (classes) together with corresponding mapping descriptions, and to map instance based exposed information model-elements to internal information model instances.

A synchronizer module of the model integration component can synchronize content values of the internal information model and the exposed information model in both directions when respective model-elements change. It can further synchronize the model structure of the information models in both directions by creating or deleting respective model-elements. In other words, the synchronizer performs a bidirectional object-model sync including services to create and delete objects, to read and write properties, to forward events and to invoke methods. This mechanism couples the live-exposed information model with the application at runtime.

For synchronizing a change associated with an information model-element the system detects a change of an internal or exposed information model-element. For example, event listeners can be used to observe the model-elements and to notify the synchronizer about any change occurring to a model-element. The synchronizer then determines a synchronization direction for propagating the detected change in one of the information models (exposed/internal) to the other information model (internal/exposed). For example, the synchronizer may compare timestamps associated with information model-elements to determine if the latest change occurred for an internal information model-element or for an exposed information model-element. The information model with the latest change is then used as the origin of the synchronization direction. In other words, if the latest change is detected for an exposed model information element the synchronization direction points towards the corresponding element in the internal information model. If the latest change is detected for an internal information model-element the synchronization direction points towards the corresponding element in the exposed model information. The allowed sync direction can also be limited or defined by mapping descriptions. Alternatively, the way how the synchronization was triggered can be used to determine the synchronization direction. For example, the synchronizer module can provide a method to trigger the update. This method can also be parameterized to limit/define the synchronization direction.

The synchronizer has information about the coherence between particular internal information model-elements and particular exposed model-elements. In other words, the synchronizer can determine a corresponding model-element related to the changed model-element. For example, ID mapping can be used for this purpose. If an exposed model-element was changed, a corresponding internal model-element is determined and vice versa.

Match-making using signatures (e.g., class signatures (name, inheritance, interfaces), field signatures (name, type, value), or method signatures) of the internal information model-elements combined with the mapping description is used to synchronize the structure of the exposed model-elements with the structure of the internal information model which may be necessary in cases where the content value corresponds to a complex object having sub-objects.

If the signatures of the exposed information model-element and the related internal information model-element match, the synchronizer synchronizes, in accordance with the determined synchronization direction, the exposed information model-element and the related internal information model. In other words, the synchronizer detects the synchronization direction and performs the synchronization of content values or model structure elements based on the known coherence between an internal information model-element and an exposed model-element.

For example, in case the change of a first exposed object is detected, the synchronizer checks if the first exposed object has an association defined in the exposed information model to a second exposed object. If there is such an association, the synchronizes further checks if the internal object that corresponds to the first exposed object matches to the signature of a field of a second internal model-element that corresponds to the second exposed model-element. If there is a signature match the field value of the second internal model-element is set to the field value of the second exposed model-element. In case the change of a first internal object is detected, the synchronizer processes (e.g., parses) the fields of the first internal object to determine a sub-object of the first internal object. The synchronizer then checks if a first exposed object corresponding to the first internal object has an association, defined in the exposed information model, to a second exposed object corresponding to the sub-object. If the association matches to the signature or mapping description at a particular field of the first internal object the corresponding association is created in the internal information model accordingly.

In one embodiment, a computer-implemented method is provided for synchronizing content values between an internal information model of an application and an exposed information model at application runtime. Internal information model-elements are mapped to exposed information model-elements via application code including mapping descriptions defining how the application data model is mapped to the exposed information model. The method includes: detecting a change of an exposed information model-element or an internal information element; determining a synchronization direction; performing match-making to determine a model-element corresponding to the changed model-element by using signatures of the related information model-elements combined with the mapping description; and, in accordance with the determined synchronization direction, synchronizing the content value of the exposed information model-element and the corresponding internal information model-element if the signature matches.

In case the content value is a primitive value, the synchronizer can directly update the content value of the determined corresponding model-element. A primitive value (or primitive data type) is a value which cannot be further partitioned (i.e., which has no further structure or methods). In case the content value represents an array (or collection, vector), the synchronizer compares and synchronizes with matching references for each array element. In case the content value is a non-primitive value related to a complex object comprising sub-objects, the synchronizer recursively applies the steps performing match-making and synchronizing the content value to all sub-objects of the complex object.

In another embodiment, a computer-implemented method is provided for synchronizing information model structures at application runtime. Again, internal information model-elements being mapped to exposed information model-elements via application code augmented with mapping descriptions define how the internal information model is (to be) mapped to the exposed information model. The method includes: detecting a model structure change in an instance space of the exposed information model, and propagating the detected model structure change to corresponding one or more internal objects of internal information model based on registered classes represented in a type-space of the exposed information model; or detecting a model structure change among internal objects of the internal information model, and propagating the detected change of the model structure to corresponding one or more exposed objects in the instance space.

In other words, if internal objects are created or removed at application runtime as changed instances of the application the respective changes are propagated to the information model server and reflected in the exposed information model after synchronization. Equally, if exposed objects are created or removed at application runtime as changed instances of the exposed information model the respective changes are propagated to the application component and reflected in the internal information model after synchronization.

The computer-implemented methods can be performed by the computer system when loading respective computer programs into a memory of the computer system and executing said programs by one or more processors of the computer system.

Further aspects of the invention will be realized and attained by means of the elements and combinations particularly depicted herein. It is to be understood that both, the foregoing general description and the following detailed description are exemplary and explanatory only and are not restrictive of the invention as described.

FIG. 1 is a block diagram of an example embodiment of a computer system 100 for automated model integration of an information model with a corresponding application according to an embodiment. Thereby, the model integration relates to model structure integration or to model content integration and occurs at application runtime. In other words, in one aspect, the model integration can handle the synchronization of values between an internal information model of the application (sometimes also referred to as application data model) and the exposed information model. In another aspect, the model integration can handle the synchronization of model structure changes between the two information models.

Figure 2A:
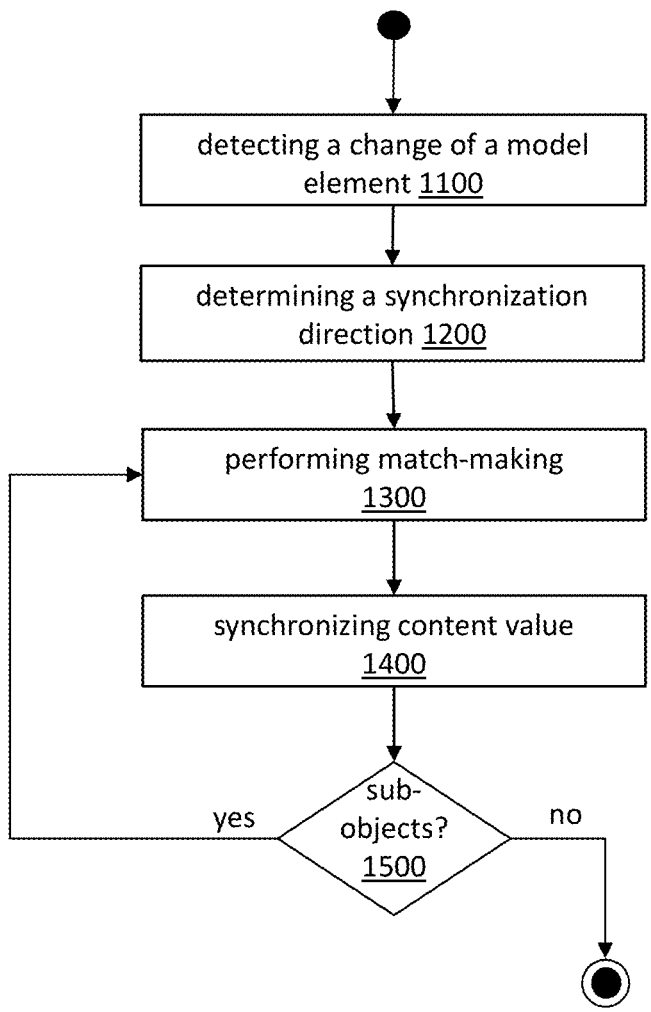
FIG. 2A is a simplified flow chart of a computer-implemented method for synchronizing content values between an internal information model of an application and an exposed information model according to an embodiment.

FIG. 2A is a simplified flow chart of computer-implemented method 1000 for synchronizing content values between an internal information model of an application and an exposed information model.

Figure 2B:
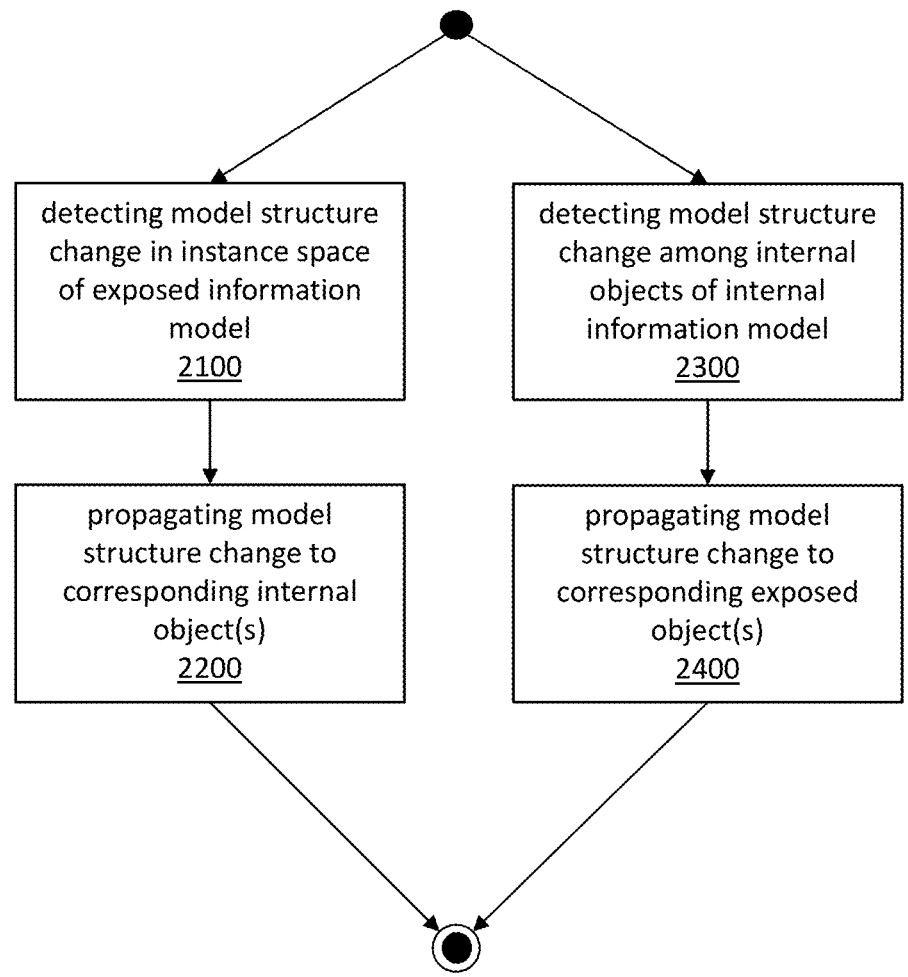
FIG. 2B is a simplified flow chart computer-implemented method for synchronizing information model structure of an internal information model of an application and an exposed information model according to an embodiment.

FIG. 2B is a simplified flow chart of computer-implemented method 2000 for synchronizing the information model structure of an internal information model of an application and an exposed information model. The computer system 100 is configured to perform both methods 1000, 2000 when synchronizing the information models. It is to be noted that content value and model structure synchronization can occur independently in the system 100.

The description of the computer system 100 is disclosing embodiments of the invention in the context of the flow charts of FIGS. 2A, 2B. Therefore, the following description uses reference numbers referring to FIG. 1, FIG. 2A and FIG. 2B. The computer system 100 includes three main components: an information model server 130, an application component 110 and a model integration component 120.

The information model server 130 has the function to expose an information model to a consumer 200. The consumer is an external entity accessing the exposed information model from outside the computer system 100. Such an external entity may be another computer system or a human user using a client computer. A human user may apply change operations to the model manually. Another system may run certain software (e.g., an engineering tool) which accesses the information model as part of its own logic like accessing a remote API. The exposed information model describes standardized nodes of the information model server's address space. These nodes are standardized types as well as standardized instances used for diagnostics or as entry points to server specific nodes. For example, the exposed information model can define the address space of an empty OPC Unified Architecture (OPC UA) server to enable interoperability. To make data exposed by the Address Space mutually understandable by diverse systems, the exposed information model standardizes the respective information representation as computer centric data. This content can be used as a starting point to discover all information relevant to any client by browsing.

The exposed information model includes exposed model-elements 131 for exposing types or classes, and for exposing instances of types or classes (exposed objects) and their member-values. In the implementation of FIG. 1, the exposed model-elements 131 have a type- or class-space 132 for exposing types or classes as part of the exposed information model, and have an instance-space 134 for exposing instances of types or classes and their member-values. The consumer 200 can interact with the exposed information model by accessing the model and the exposed objects to perform actions, such as for example, read, write, browse, or subscribe. For example, a user of the system can send a request to the information model server 200 to create or delete an exposed object at application runtime to adjust the model structure.

The type-space 132 may further include a handler 133. The handler is configured to inform the model-integration component 350 about create requests of the Consumer 200, targeting the creation of a new exposed object 134 based on a exposed type 132. This handler triggers the instantiation of new corresponding internal object 114. Similar to the handler 133, a handler can also be part of an internal model-element to inform the logic that is implemented as part of an internal model-element about any changes of content values or model structures. In case of an internal model-element a handler interface is typically defined using normal interfaces as known in object-oriented programming languages. Known mechanisms of the modeling technology (like OPC UA Subscriptions) can be used to inform the client/consumer about changes (value or structural changes) made at the exposed model. Whenever the synchronization changes the exposed model (value change and/or structural change) related OPC UA Subscriptions are triggered accordingly.

The computer system 100 further includes an application component 110 to provide application code augmented with mapping descriptions 113 defining how an internal information model of the application is mapped to the exposed information model. Examples of mapping descriptions are explained in detail in the description of FIGS. 3a, 3B. The application code defines the internal information model (application data model) including internal model-elements 111. The internal model-elements 111 use types/classes 112 with the mapping descriptions 113 being a part of the types/classes 112. Instances of the type/class definitions are created as internal objects 114 of the application.

The system 100 further has a model integration component 120 which provides the functions to integrate the internal information model and the exposed information model in that an appropriate mapping between the information models allows the consumer to interact with the application through the exposed information model.

For achieving this goal the model integration component 120 has a registry module 121 to register 330 internal information model-elements 111 to be exposed in the exposed information model at the information model server 130. The registration can be triggered in the code and/or automatically by the model Integration component 120 parsing accessible code looking for respective mapping descriptions. When parsing the application code, the registry 121 becomes aware of internal application types/classes 112 (e.g., through respective annotations implementing the mapping descriptions) which are subject to exposure in the exposed information model. Thereby, a particular mapping description is used for selecting one or more internal model-elements 111 to be exposed in the type- or class-space 132 of the exposed information model.

A mapping module 122 of the model integration component 120 can then map the registered types/classes 112 to exposed information model-elements 131 so that the mapped types/classes are exposed 340 in the type-space 132 of the exposed information model. In other words, the exposed model-elements 131 have a type- or class-space 132 for exposing types or classes as part of the exposed information model. Further, they have an instance-space 134 for exposing instances of types or classes and their member-values. This mapping is performed in accordance with the mapping descriptions in the application code. For mapping of exposed information model-elements to corresponding internal information model-elements 111 the mapping module can parse fields and methods of respective internal information model types/classes 112 together with corresponding mapping descriptions 113, and map instance based exposed information model-elements (exposed objects 134) to corresponding internal information model instances (internal objects 114). The handler 133 is a mechanism where the model integration 120 can register a callback-method at a type in the type-space 132 that will be called by the information model server 130 whenever an instantiation of the respective type is requested by the consumer 200. This handler is used to register the "instantiate" method of the factory 124 shown in FIG. 4C.

A synchronizer module 123 of the model integration component is implemented to synchronize 310, 320 content value and/or model structure changes associated with an information model-element on either side (i.e., changes occurring either within an internal model-element 111 or an exposed model-element 131).

For this purpose, the synchronizer 123 first detects 1100, 2100, 2300 a change of an internal or exposed information model-element at application runtime. Such a change may relate to a content value change of a particular information model-element or it may relate to a structural change in the respective information model (e.g., the creation of a new model instance/object or the removal of an existing model instance/object). If the change occurs within the exposed information model, the change is typically triggered by a respective action (e.g., create, update, delete) of a client/consumer 200 interacting with the exposed information model. If the change occurs at the application component 110, the change may be triggered by a change of a field value of a respective internal object 114 (e.g., content value change of a sensor value). Handlers of the programming language of the application can be used to react on changes on the internal information model (e.g. to "hook in" to getters and setters) and to trigger the synchronization from the internal to the exposed information model. Alternatively, the application can manually trigger the synchronization calling an "update" method as shown in FIG. 4E.

The synchronizer 123 then determines 1200 a synchronization direction. In other words, the synchronizer detects in which information the change occurred and concludes that the change needs to be propagated to the other information model. There are different options available to derive the synchronization direction. For example, the system can simply compare timestamps associated with information model-elements to determine if the latest change occurred for an internal information model-element or for an exposed information model-element. The information model with the latest change is then used as the origin of the synchronization direction. Alternatively, in case the information model server 130 implementing the exposed information model detects the change, the information server can notify the synchronized accordingly to set the exposed information model as the origin of the synchronization direction. In case the application component 110 implementing the internal information model detects the change, the application component can notify the synchronizer accordingly to set the internal information model as the origin of the synchronization direction. For example, an application can trigger the synchronization—e.g. by using a method (at the synchronizer 123) that starts the synchronization and defines the direction.

The synchronizer 123 further performs match-making 1300 to determine a model-element corresponding to the changed model-element by using signatures of the corresponding information model-elements combined with the mapping description. The signature is determined based on respective information in the code, for example by using introspection. For example, class signatures (name, inheritance, interfaces), field signatures (name, type, value) and method signatures (name, input and output parameters may be used to compare information model-elements and determine whether they correspond or not. The mapping descriptions may provide additional information which can be useful for the match-making. For example, identifiers of types (object-types or reference-types) as defined in the exposed information model may be used within the mapping descriptions to determine corresponding objects.

Once the synchronization direction is known and the corresponding information model-elements are identified, the synchronizer can synchronize changes in the content values 1400 or in the model structure 2200, 2400, in accordance with the determined synchronization direction.

In case a change occurs in a content value which is a non-primitive value in that the content value is a complex object comprising sub-objects, the match-making and synchronizing steps are recursively applied to all sub-objects of the complex object. In other words, if the content change is detected for a complex object there is no simple correspondence between respective objects in the instance space 134 and the internal objects 114. Rather, the structure of the complex object needs to be recursively resolved and for each identified sub-object a corresponding sub-object is identified through match-making. For each resolved sub-object the content values of the corresponding sub-objects can be synchronized if the sub-object has a primitive value. If a particular sub-object is a complex object itself, the recursion is also applied to the particular sub-object.

Figure 2C:
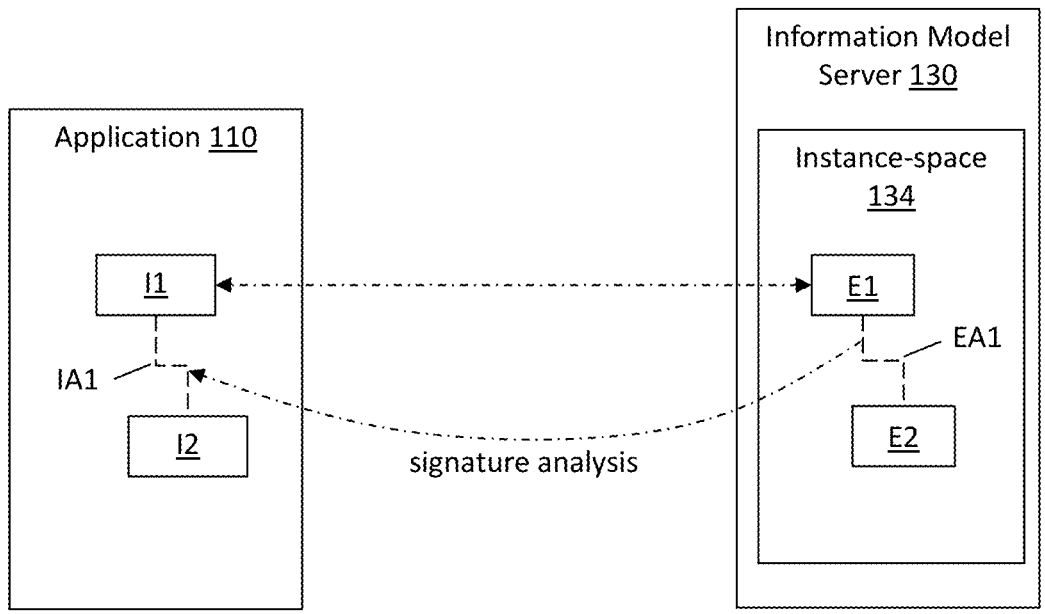
FIGS. 2C, 2D illustrate two synchronization scenarios with associations between objects.
Figure 2D:
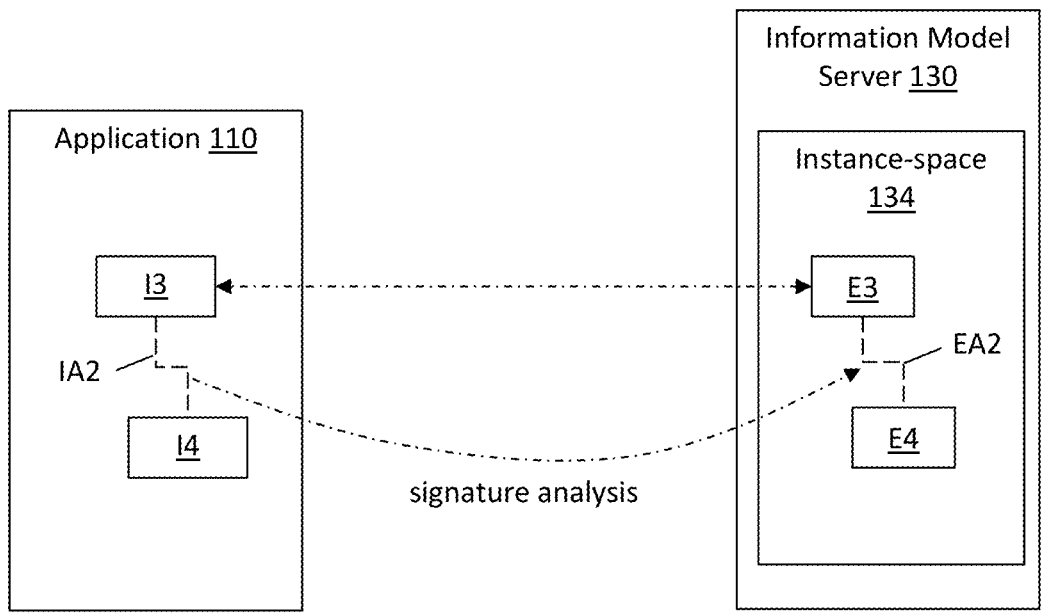

In some cases of synchronizing content values comprising complex objects, the structure of the changed complex object needs to be propagated to the information model which is to be updated. FIGS. 2C and 2D illustrate two match-making/synchronization scenarios for a complex object including a sub-object. The dash-dotted double arrows indicate correspondences between internal and exposed objects as known from the initial model mapping.

FIG. 2C illustrates an example where a model structure change occurs in the exposed information model at the information model server 130. The system detects a change of a first exposed object E1 in the instance-space 134. The system checks if the exposed object E1 is a complex object by checking if the first exposed object E1 has at least one (exposed) association EA1 defined in the exposed information model to at least a second exposed object E2. If there is such an association EA1, the synchronizer checks if a particular internal object I1 that corresponds to the first exposed object E1 matches to the signature of a field of a second internal model-element I2 wherein this second internal model-element I2 corresponds to the second exposed model-element E2. If there is a signature match the field value of the second internal model-element I2 is set to the internal object I1. That is, for building the structure of the internal information model the respective internal objects need to be associated via the (internal) association IA1. This is achieved by putting a complex internal object into the field of another internal object.

If, for example, a consumer wants to create a new state and add it to a Finite-State-Machine as shown in FIG. 3B, the user instantiates a new exposed model-element of the exposed type that was created for the class "StateMachine-VariableType" and links it with a reference to the exposed model-element that represents an instance of the FiniteStateMachine. In this case, the new exposed model-element that represents the state is E2 and the exposed model-element that represents the FiniteStateMachine is E1. As reaction of this change of the exposed information model, the synchronizer performs a synchronization from the exposed information model to the internal information model and identifies the internal object I1 that corresponds to E1, and that is an instance of the class "StateMachine-VariableType". On this class, which is shown in FIG. 3B, the synchronizer performs the match-making between the signature of the fields of the internal object I1 and the external object E2 together with the reference between the external objects E1 and E2. The annotations "@Reference" at the fields "currentState" and "states" (cf. FIG. 3B) are indicating that sub-objects might be synchronized based on exposed model-elements. As both annotations make no further specification of a reference type a default reference-type is used for match-making. Alternatively, it can be implemented that "any" reference-type can match in such case). If the reference being used to link E1 with E2 matches to this default reference-type a match-making of object-types is done. During instantiation of E2 an internal object I2 is created based on the type/class 112 that was registered before for the type E2. If the class of I2 is assignable to the actual field of I1 that is evaluated by the match-making process, I2 is added to the matching field. In the described example both fields "currentState" and "states" are matching but only the field "states" is allowed to be updated by the exposed information model—as defined by the mapping description by setting the property import to false.

FIG. 2D illustrates an example where a model structure change of a complex object occurs in the internal information model at the application component 110. The synchronizer detects a change of a third internal object I3 and processes the fields of the third internal object I3 to determine a sub-object I4 of the third internal object. In other words, the synchronizer determines the (internal) association IA2. Then, the synchronizer checks if a third exposed object E3 which corresponds to the third internal object I3 has an association EA2, defined in the exposed information model, to a fourth exposed object E4 corresponding to the sub-object I4. If no found association matches to the signature and the mapping description of the field where I4 is located, the targeted association EA2 between E3 and E4 is created. In case the change is related to a deletion of I4 (i.e. an empty field at I3) matching associations are removed accordingly.

Following the aforementioned example: if the application adds a new instance of a StateMachineVariableType I4 to the field "states" of a Finite-State-Machine I3 the synchronizer evaluates all existing associations (references) of the exposed instance of this Finite-State-Machine E3. Because E4 is a new created object no matching reference will exist up to this point in time. As a result, a new reference EA2 between E3 and E4 is created. In the example of FIG. 3B, the type is not further defined in the annotation @Reference at the actual field "states" and, therefore, reference will be of the default reference type.

When synchronizing model structure changes between the information models, different types of changes can be distinguished. The most common model structure changes relate to creating a new object (instance) in one of the information models or removing an existing object (instance) from one of the information models. In the following, details of four update scenarios are described: intention to create an internal object, intention to create an exposed object, intention to remove an exposed object, and intention to remove an internal object. Thereby, the reference numbers relate to FIG. 1 again.

In a first update scenario, the detected model structure change intends to create an internal object 114 from a created new exposed object 134. For example, the consumer 200 has sent a create command to the information model server to create a new object based on a certain type defined in a type-space 132 of the exposed information model. The synchronizer determines the corresponding internal type/class 112 and creates a new internal object 114 of the corresponding type/class 112. The fields of the new internal object 114 are initialized with information coming from the respectively created new exposed object 134 by applying a respective mapping description.

Following the aforementioned state machine example: if the consumer creates an instance of a Finite-State-Machine in the exposed information model, an instance of the class that was registered (cf. register method in FIG. 4A) for the exposed type of the Finite-State-Machine is created. The exposed object instance of the Finite-State-Machine can have sub-objects according to the exposed type of the Finite-State-Machine—e.g. it can be initialized with a certain set of instances of StateMachineVariableType. In case of additional states that were created by the consumer in the exposed information model, the synchronizer recursively follows the structure of the exposed model-element for the Finite-State-Machine in order to create corresponding internal objects for each state, initializes the values and adds them to the field "states" of the internal object that was created for the Finite-State-Machine.

In a second update scenario, the detected model structure change intends to create an exposed object 134 from a created new internal object 114 of a certain internal type/class 112. The synchronizer determines the corresponding type in the exposed type-space 132 and adds a new exposed object 134 of the corresponding type to the instance-space 134. If the created new internal object 114 is a complex object having one or more sub-objects, the content of the created new internal object 114 is recursively processed to create exposed model-elements for the one or more sub-objects of the complex object.

Following the aforementioned state machine example: if the application creates an instance of a Finite-State-Machine in the internal information model, an instance of the exposed type that was created for the class of the Finite-State-Machine is created. The internal object instance of the Finite-State-Machine can be initialized with sub-objects contained in the fields e.g. it can be initialized with a certain set of instances of StateMachineVariableTypes. In case of additional states that were created by the application in the internal information model, the synchronizer recursively follows the structure of the internal model-element for the Finite-State-Machine in order to create exposed objects for each state, initializes the values and creates respective references between the Finite-State-Machine and its states according to the Annotation @Reference at the field "states".

In a third update scenario, the detected model structure change intends to remove an exposed object from the instance space 134. The synchronizer determines the corresponding internal object 114 and removes the corresponding internal object. If a complex object is to be removed, all associations and sub-objects are removed too by recursively processing the complex object.

Following the aforementioned state machine example: if the consumer removes one state from the Finite-State-Machine, the corresponding internal object for this state is determined and removed at the field of the corresponding internal object for the Finite-State-Machine.

In a fourth update scenario, the detected model structure change intends to remove an internal object 114 from the internal information model. The synchronizer determines the corresponding exposed object in the instance-pace and removes it from the instance space 134. If the removed internal object 114 is a complex object having sub-objects the content of the removed internal object 114 is recursively processed to identify and remove the exposed (sub-)objects that were created for the content of the complex exposed object.

Following the aforementioned state machine example: if the application removes one state from the Finite-State-Machine, the corresponding exposed object for this state is determined. The exposed object is removed and all references matching to the signature at the field of the corresponding internal object for the Finite-State-Machine are removed from the exposed object instance that represents the Finite-State-Machine.

FIG. 3A shows table 310 with examples of annotation mechanisms ($1^{st}$ column) and annotation examples ($2^{nd}$ column) which can be used to define an information model. In the example, the annotated classes comply with the OPC UA Meta-Model. The $3^{rd}$ column includes and explanation of the respective annotations with the rationale behind.

The re-use of existing classes may require filtering of classes that shall be used for the exposed information model. The annotation @Node may be used to define relevant classes and to differentiate between Nodes and References following RDF/OPC UA concepts. The annotation @ID describes an identifier which allows to identify objects in order to associate them with nodes in the information model. The annotations @Reference indicate fields of objects to be exposed as (sub-)nodes. If a node is considered to be a (UA) variable, it can expose a field as "Value" of this (variable-) node using the annotation @Value at the respective field. The annotation @Method allows to expose methods to embedded logic. Additional annotations, such as for example, @BrowseName, @DisplayName, @Description, @DataType can be used on fields to use their values to fill meta data of the respective exposed node(s). The example list is not meant to be complete. A person skilled in the art may define further useful annotations to define mapping descriptions.

FIG. 3B includes an example code 320 showing an annotated class that implements a FiniteStateMachineType of a PackML state machine using annotated classes following the OPC UA Meta-Model. PackML (Packaging Machine Language) is an industry technical standard for the control of packaging machines, as an aspect of industrial automation. The following implementation example was already referred to previously as the state machine example. Thereby, the example code (left column of table 320) makes use of the annotations explained in FIG. 3A. The functions of the various code portions are explained in the descriptions given in the right column of table 320. If annotations like BrowseName, DisplayName or DataType are not given, they can be automatically derived from respective field-names, field-types or class-names. Each annotation can hold additional properties to parameterize the mapping (if it differs from the automatic mapping): For example, @Reference at a field can be mapped to a hasComponent reference by default—however, if another reference type is required, it can be overwritten e.g. using the following notation: @Reference(refType=UAReferenceTypes.organizes)

The example implementation of a finite state machine inherits the implementation of a state machine—i.e. fields or methods that are exposed in that super-class are also taken into account.

Meta data that is used to describe the related node can be obtained from the class or the object. In the example, the browse and display names can be generated based on the value at the field "name". If no annotation is given an automatism tries to derive a meaningful name based on the class (or the field name of the parent that contains this object).

The node identifier (ID) could can also be generated based on a field value. However, if the annotation @ID is not given (as in the example), the ID can be generated automatically.

In the example, the browse and display names are determined based on the value of the field "name". The "currentState" contains a further (non-primitive) object. The @Reference annotation ensures that the further object will be also processed, and the resulting node will be referenced from the node that represents the further object.

The content of the collection "states" can be processed the same way. To differentiate said content from values of other fields (like "currentState") an intermediate node "states" may be inserted. Already processed objects can be identified (e.g., if the current state is also part of the collection "states"). In such cases the related node is created only once and referenced multiple times.

An EventHandler interface is implemented—i.e. the "handle" method is called whenever something happens on the node or the object. The EventHandler may also support to subscribe on other objects or nodes. This mechanism can be used within the state machine to observe properties or methods that should trigger a state change. That is, an Event object is created and passed to the handle( ) method as a notification in response to a value change of a property. The contained business logic can then process the transition and update the "currentState" accordingly.

In the following some concepts and their possible respective implementations/rationales are explained:

Existing objects can be registered at a registry. Their fields and methods can be exposed following the given annotations at the respective classes. The annotations describe how to represent the annotated elements in the information model (address space).

Type-Space Factory/Registrar: Classes (using annotations) can be registered at a registry. These types are then exposed in the type space of the information model. Through this factory (type-safe) instances can be created using copies of respective type definitions as a basis.

Bi-Directional Sync: For each node a wrapper is created that maintains all information that is needed to synchronize an Object with related nodes and references. When an object changes it can call an update method at the registry. The registry can determine the related wrapper for synchronizing related nodes and references. When a node or reference is added, removed or modified the information model server can invoke also a corresponding update method which in turn updates the object(s). A wrapper can be understood as a component which knows both sides of the synchronization and enables the data exchange between the exposed information model and the internal information model. Sometimes wrappers are referred to as association classes acting as a coupling object between the information models.

Read, Write, Subscription: Value changes at anode or an object can also be handled via the bi-directional sync. If supported by the modelling technology, a "subscription" can be established by the consumer—to inform the consumer on changes on the exposed information model (e.g. value/structure changes). Changes at nodes are also exposed on established subscriptions of the consumer.

If the synchronizer updates values or the structure of the exposed information model, existing subscriptions can be processed/called accordingly to inform the consumer (comparable to the call of the update-handler for the inverse direction)

Event-Handler: The wrapper can monitor the related Nodes in order to pass through changes to related objects. An object can implement an Event-Handler. For example, if changes at related nodes and references should be handled immediately within the business logic.

In the OPC UA core model the basic types for a state machine are already defined in the OPC UA Specification Release 1.02, Part 10: Programs, May 2012. However, the specification targets only the representation of a state machine without means to handle transitions based on property changes. In contrast, the example code 320 is setup to handle transitions annotated classes for a state machine. The states and state transitions are provided in the example code 320. The state machine knows its array of states and such states know their transitions. For example, the number of transitions may be deposited in the state machine by the following code portion:

@Reference
public ArrayList<TransitionType> transitions

The example classes are annotated in a way that they are registered for the related types in OPC UA.

Whenever one of these classes is instantiated through the creation of an OPC UA node or a field on such object was changed due to a change in the UA information model (Mechanism 3), the EventHandler of these objects is called. I.e. when a UA Reference to a node representing a state was added to the state machine, the collection states is updated, and the Handler is called. In such cases the Handler starts a process (e.g. checkState( ) in the example in Section @Method in FIG. 3B) that handles the changed object structure. In this process the state machine subscribes to changes on the currentState, the states subscribe to changes on the related transitions and the transitions subscribe to referenced (monitored) parameters and methods. Finally, a change of a parameter value is propagated up to the state machine that can evaluate the transition and eventually proceed to the next state. After proceeding to the next state as value of the field currentState, the state machine has to update the representation in OPC UA using the update method on this field (Mechanism 5).

FIGS. 4A to 4E illustrate five integration mechanisms for integrating the internal and exposed information models at application runtime. Thereby, the various modules of the model integration component 120 in FIG. 1 are collectively referred to as factory 124.

Figure 4A:
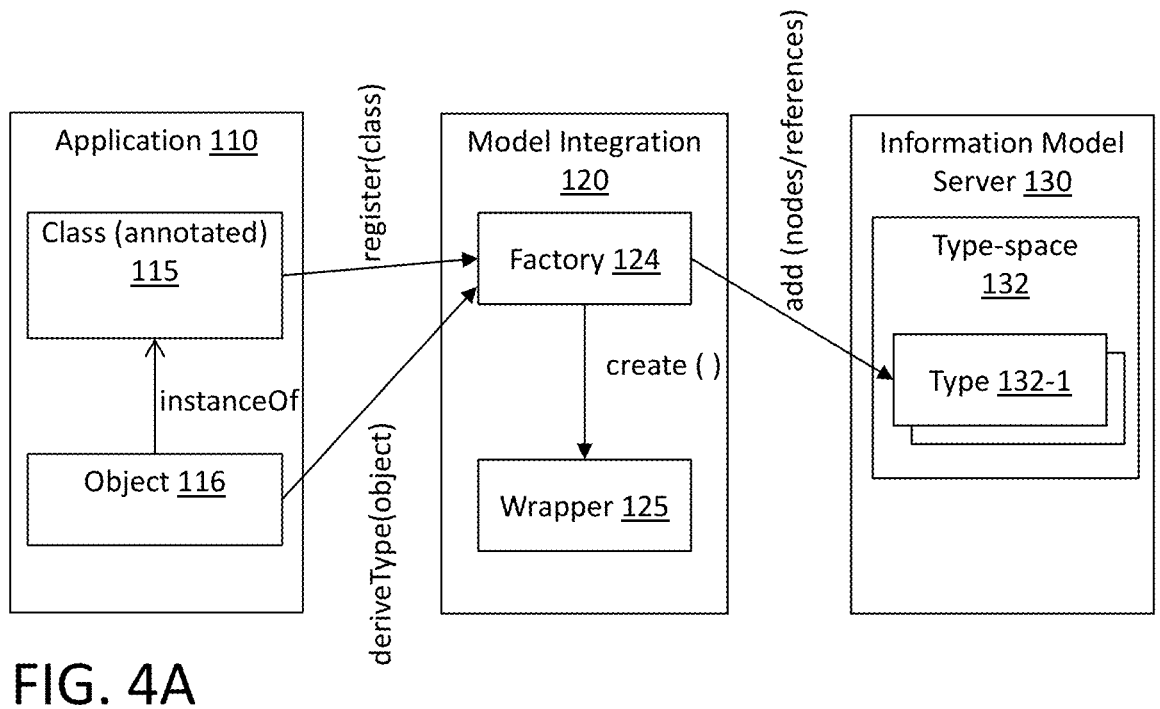
FIGS. 4A to 4E illustrate integration mechanisms for integrating the internal and exposed information models at application runtime according to five embodiments.

FIG. 4A illustrates a first integration scenario when registering new application classes in the internal information model of the application component 110. Using the method register( ) classes can be registered at the factory 124. The classes are parsed, and corresponding wrappers 125 are generated. The corresponding nodes are exposed in the type-space 132 of the respective exposed model-elements. If a type 132-1 is created potential inherited types can be analyzed by reflection in order to find an anchor within the type-space 132 where this new type 132-1 can be registered as subtype. Also objects 116 can be registered as types in the exposed information model (e.g., by using the derive Type ( ) method). This can be advantageous when a pre-parameterized object is to be used as template for instances (e.g., an Example_DeviceType can instantiate a respective DeviceType.class and, for example, predefine vendor specific parameters).

Figure 4B:
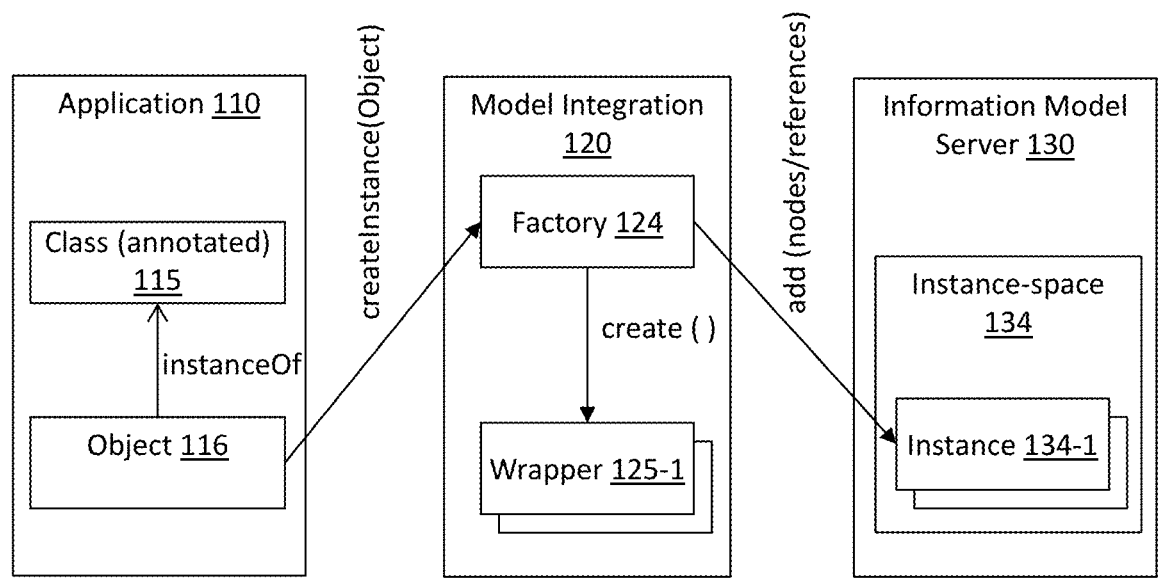

FIG. 4B illustrates a second integration scenario of application objects with the instance space 134 of the exposed model-elements. The factory 124 parses the object 116 following the mapping descriptions in the annotations (and using introspection) of the related class 115 in order to create wrappers 125-1 for each node and reference that is needed to represent the object 116. The generated wrappers 125-1 are registered, and the related nodes and references of the wrappers (instances 134-1, . . . ) are added to the instance space 134. When the wrapper is created it is initialized. That is, the meta data of the node (like the node id, the browse name and the display name) is determined. In case of the node id and the browse name, this may be done only once in the beginning because such aspects of a node cannot be changed after creation. In cases like the display name, a sync can also update the actual display name—e.g. if the value of the annotated field changes.

In the first and second integration scenarios the factory 124 parses all fields and methods of a respective class or object to expose the content of an object. Advantageously, this is performed recursively so that all contained sub-objects can be handled the same way. As a consequence, the registration of a class or the instantiation of an object creates all wrappers and elements within the exposed information model that are required to comprehensively represent the object within the exposed information model.

Figure 4C:
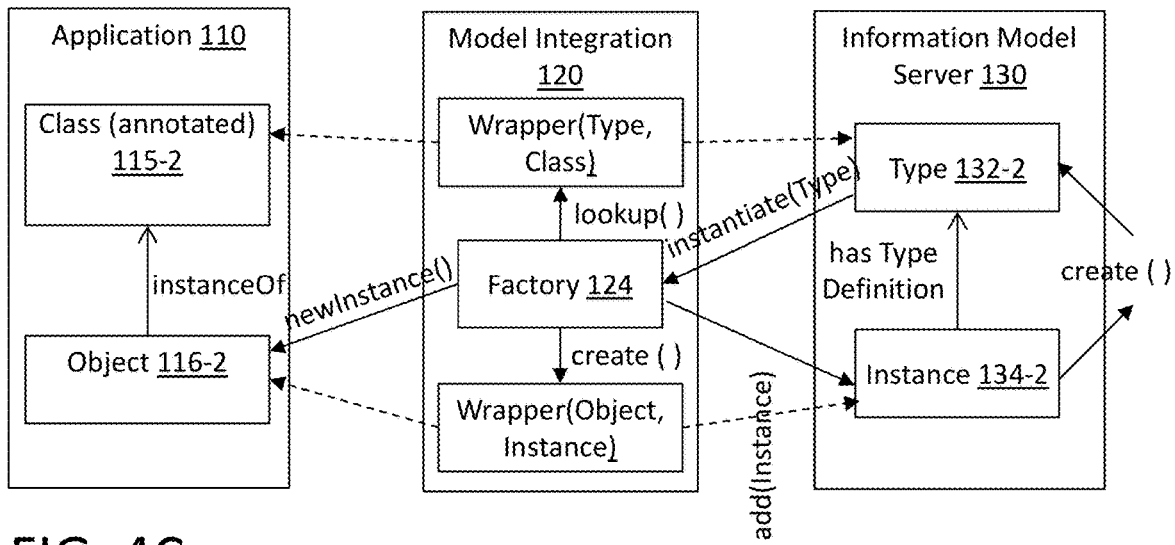

FIG. 4C illustrates a third integration scenario where a consumer of the exposed information model creates an instance of a type of an exposed model-element. When the consumer wants to create an instance 134-2 of a type 132-2 a callback registered at this type 132-2 executes the instantiation process (method instantiate( )) within the factory 124. The factory determines the related wrapper that was registered for that type (method lookup( )). Then, the factory creates an instance of the related class 115-2 (method newInstance( )) and processes the respective object 116-2 within the factory (method create ( ) similar to the second integration scenario). Finally, the newly created node is added to the instance space (method add( )) and it is used as result of the initial call for the consumer. The dotted arrows in the figure stand for "knows" relations:

The wrapper for a type knows the Class and the Type-Node.

The wrapper for an instance knows the Object in the Instance-Node

Figure 4D:
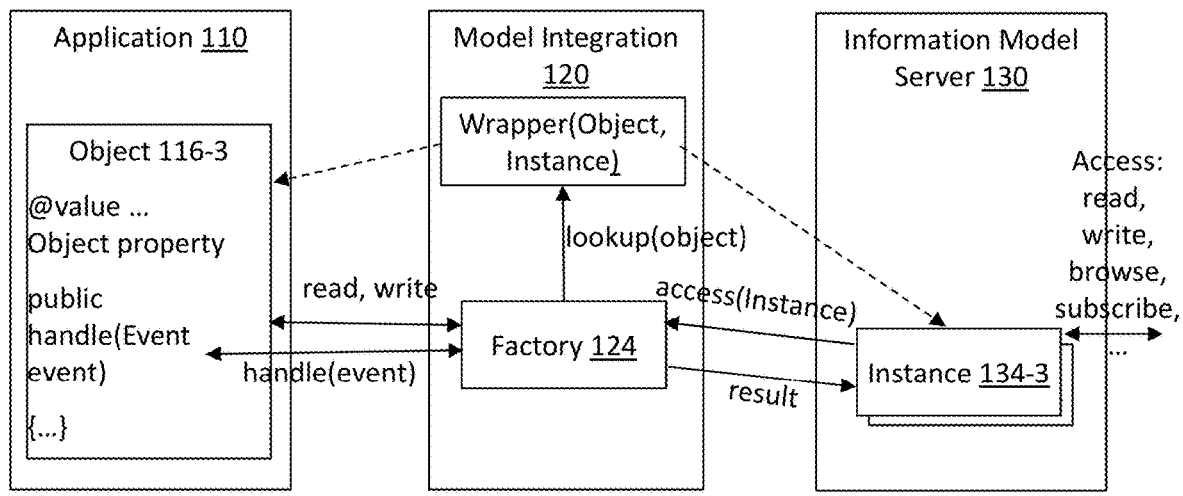
Figure 4E:
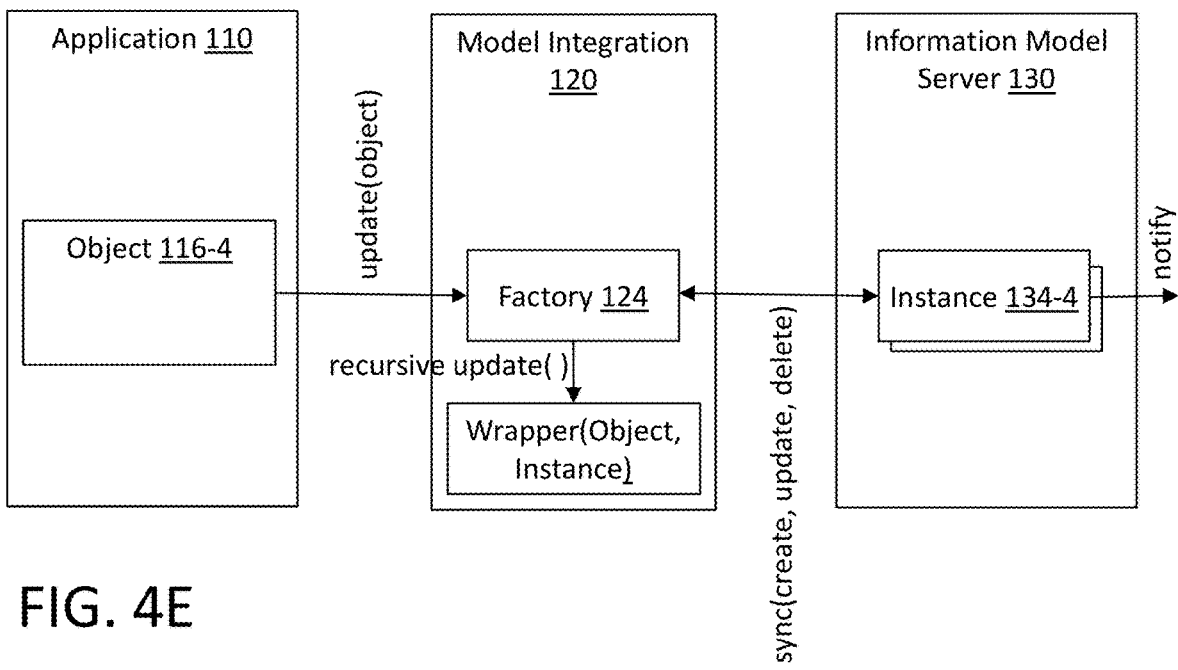

FIG. 4D illustrates a fourth integration scenario where the exposed information model acts like a façade for related application objects. When a consumer accesses an instance 134-3 in the exposed information model, the related wrapper is taken from the registry of the factory (method access( ) and method lookup( )). This wrapper contains a link to the related object 116-3 in the application component 110. The access type for the exposed model-element(s) is passed to the related object 116-3 (read, write, etc.). For example, in case of value-reading or a value-writing the annotated field that contains the actual value is accessed. If the object 116-3 implements an EventHandler interface, this handler is called (method handle( )) before and/or after the object access (depending on the access-mechanism). The result is returned to the consumer via the accessed instance 134-3.

FIG. 4E illustrates a fifth integration scenario for synchronizing exposed model-elements synchronization with internal model-elements. Whenever an object 116-4 is changed, the exposed information model can by synchronized with the changed object using the update( ) method at the factory 124. As discussed in the previous scenarios, an object can be related to multiple wrappers and elements in the exposed information model. The factory determines the related wrappers and processes them recursively (method recursive update( )) in order to adjust the representation in the exposed information model to the actual state of the object (method sync( )). In case the consumer is subscribed to a value- or structural-change a notification is sent accordingly.

This sync can be performed bi-directionally. That is, when the exposed information model includes elements that match to the respective internal information model, the structure of the internal information model is updated accordingly. For example, if a node describing a parameter is added as an element of a further node describing a parameter set, the field with the vector that holding the collection of parameters of the parameter set is updated.

Figure 5:
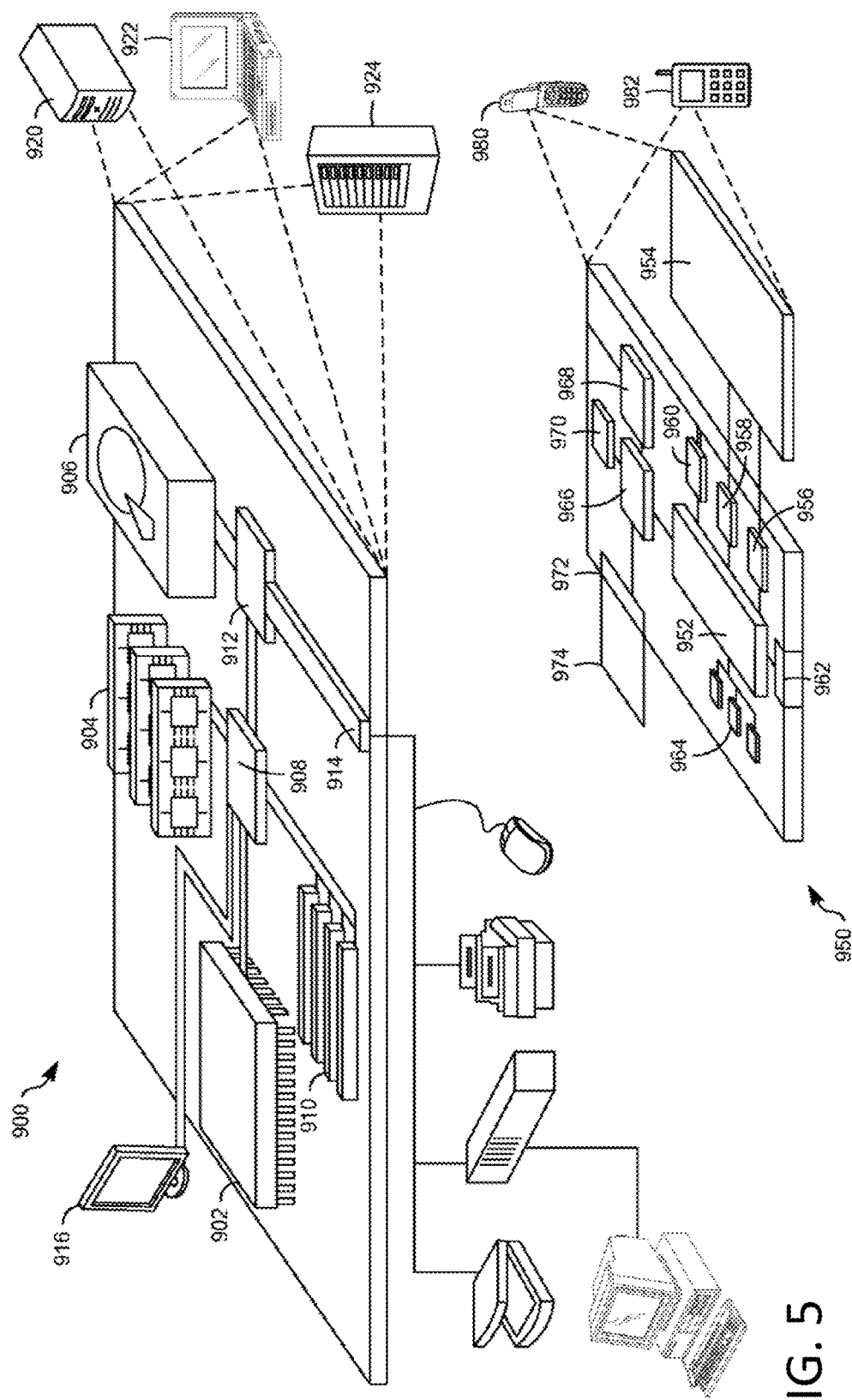
FIG. 5 is a diagram that shows an example of a generic computer device and a generic mobile computer device, which may be used with the techniques described herein.

FIG. 5 is a diagram that shows an example of a generic computer device 900 and a generic mobile computer device 950, which may be used with the techniques described here. In some embodiments, computing device 900 may relate to the system 100 (cf. FIG. 1). Computing device 950 is intended to represent various forms of mobile devices, such as personal digital assistants, cellular telephones, smart phones, and other similar computing devices. In the context of this disclosure the computing device 950 may allow a human user to interact with the device 900. In other embodiments, the entire system 100 may be implemented on the mobile device 950. The components shown here, their connections and relationships, and their functions, are meant to be exemplary only, and are not meant to limit implementations of the inventions described in this document.

Computing device 900 includes a processor 902, memory 904, a storage device 906, a high-speed interface 908 connecting to memory 904 and high-speed expansion ports 910, and a low speed interface 912 connecting to low speed bus 914 and storage device 906. Each of the components 902, 904, 906, 908, 910, and 912, are interconnected using various busses, and may be mounted on a common motherboard or in other manners as appropriate. The processor 902 can process instructions for execution within the computing device 900, including instructions stored in the memory 904 or on the storage device 906 to display graphical information for a GUI on an external input/output device, such as display 916 coupled to high speed interface 908. In other implementations, multiple processors and/or multiple buses may be used, as appropriate, along with multiple memories and types of memory. Also, multiple computing devices 900 may be connected, with each device providing portions of the necessary operations (e.g., as a server bank, a group of blade servers, or a multi-processor system).

The memory 904 stores information within the computing device 900. In one implementation, the memory 904 is a volatile memory unit or units. In another implementation, the memory 904 is a non-volatile memory unit or units. The memory 904 may also be another form of computer-readable medium, such as a magnetic or optical disk.

The storage device 906 is capable of providing mass storage for the computing device 900. In one implementation, the storage device 906 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 904, the storage device 906, or memory on processor 902.

The high speed controller 908 manages bandwidth-intensive operations for the computing device 900, while the low speed controller 912 manages lower bandwidth-intensive operations. Such allocation of functions is exemplary only. In one implementation, the high-speed controller 908 is coupled to memory 904, display 916 (e.g., through a graphics processor or accelerator), and to high-speed expansion ports 910, which may accept various expansion cards. In the implementation, low-speed controller 912 is coupled to storage device 906 and low-speed expansion port 914. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 900 may be implemented in a number of different forms, as shown in the figure. For example, it may be implemented as a standard server 920, or multiple times in a group of such servers. It may also be implemented as part of a rack server system 924. In addition, it may be implemented in a personal computer such as a laptop computer 922. Alternatively, components from computing device 900 may be combined with other components in a mobile device, such as device 950. Each of such devices may contain one or more of computing device 900, 950, and an entire system may be made up of multiple computing devices 900, 950 communicating with each other.

Computing device 950 includes a processor 952, memory 964, an input/output device such as a display 954, a communication interface 966, and a transceiver 968, among other components. The device 950 may also be provided with a storage device, such as a microdrive or other device, to provide additional storage. Each of the components 950, 952, 964, 954, 966, and 968, are interconnected using various buses, and several of the components may be mounted on a common motherboard or in other manners as appropriate.

The processor 952 can execute instructions within the computing device 950, including instructions stored in the memory 964. The processor may be implemented as a chipset of chips that include separate and multiple analog and digital processors. The processor may provide, for example, for coordination of the other components of the device 950, such as control of user interfaces, applications run by device 950, and wireless communication by device 950.

Processor 952 may communicate with a user through control interface 958 and display interface 956 coupled to a display 954. The display 954 may be, for example, a TFT LCD (Thin-Film-Transistor Liquid Crystal Display) or an OLED (Organic Light Emitting Diode) display, or other appropriate display technology. The display interface 956 may comprise appropriate circuitry for driving the display 954 to present graphical and other information to a user. The control interface 958 may receive commands from a user and convert them for submission to the processor 952. In addition, an external interface 962 may be provide in communication with processor 952, so as to enable near area communication of device 950 with other devices. External interface 962 may provide, for example, for wired communication in some implementations, or for wireless communication in other implementations, and multiple interfaces may also be used.

The memory 964 stores information within the computing device 950. The memory 964 can be implemented as one or more of a computer-readable medium or media, a volatile memory unit or units, or a non-volatile memory unit or units. Expansion memory 984 may also be provided and connected to device 950 through expansion interface 982, which may include, for example, a SIMM (Single In Line Memory Module) card interface. Such expansion memory 984 may provide extra storage space for device 950, or may also store applications or other information for device 950. Specifically, expansion memory 984 may include instructions to carry out or supplement the processes described above, and may include secure information also. Thus, for example, expansion memory 984 may act as a security module for device 950, and may be programmed with instructions that permit secure use of device 950. In addition, secure applications may be provided via the SIMM cards, along with additional information, such as placing the identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 964, expansion memory 984, or memory on processor 952, that may be received, for example, over transceiver 968 or external interface 962.

Device 950 may communicate wirelessly through communication interface 966, which may include digital signal processing circuitry where necessary. Communication interface 966 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 968. In addition, short-range communication may occur, such as using a Bluetooth, WiFi, or other such transceiver. In addition, GPS (Global Positioning System) receiver module 980 may provide additional navigation- and location-related wireless data to device 950, which may be used as appropriate by applications running on device 950.

Device 950 may also communicate audibly using audio codec 960, which may receive spoken information from a user and convert it to usable digital information. Audio codec 960 may likewise generate audible sound for a user, such as through a speaker, e.g., in a handset of device 950. Such sound may include sound from voice telephone calls, may include recorded sound (e.g., voice messages, music files, etc.) and may also include sound generated by applications operating on device 950.

The computing device 950 may be implemented in a number of different forms, as shown in the figure. For example, it may be implemented as a cellular telephone 980. It may also be implemented as part of a smart phone 982, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing device that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing device can include clients and servers. A client and server are generally remote from each other and typically interact through a communication network. The relationship of client and server arises by virtue of computer programs running on the respective computers and having a client-server relationship to each other.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A computer system for automated model integration of an information model with a corresponding application for direct access to live values of application elements at runtime by a consumer, the consumer being an external entity outside the computer system, the system comprising:
    an information model server configured to expose an information model to the consumer for accessing the exposed information model by the consumer from outside the computer system, the exposed information model comprising model-elements for exposing entity types representing devices in a network, and for exposing instances of types or classes and their member-values to the consumer, the exposed information model configured for interaction with the consumer to browse the actual configuration of the application and make use of types or classes that are represented in the exposed information model to create instances in the exposed information model at application runtime;
    an application component configured to provide application code augmented with mapping descriptions defining how an internal information model of the application is mapped to the exposed information model; and
    a model integration component configured to:
    register internal information model-elements to be exposed;
    map the registered internal information model-elements to exposed information model-elements in accordance with the mapping descriptions; and
    update an information model-element by:
        detecting a change of an internal or exposed information model-element;
        determining a synchronization direction;
        performing match-making to determine a model-element corresponding to the changed model-element by using signatures of the corresponding information model-elements combined with the mapping description; and
        synchronizing, in accordance with the determined synchronization direction, the exposed information model-element and the corresponding internal information model-element to propagate the change between the exposed information model accessed by the consumer and the internal information model of the application at application runtime.

2. The computer system of claim 1, wherein synchronizing the model-elements relates to model structure synchronization, or to model content synchronization, or to model structure synchronization and model content synchronization, and occurs at application runtime.

3. The computer system of claim 1, wherein the exposed model-elements have a type- or class-space for exposing types or classes as part of the exposed information model, and have an instance-space for exposing instances of types or classes and their member-values.

4. The computer system of claim 3, wherein a particular mapping description is configured for selecting one or more elements of the internal information model to be exposed in the type- or class-space of the exposed information model.

5. The computer system according to claim 1, wherein the model integration component is configured to map the registered internal information model-elements by parsing fields and methods of respective internal information model types/classes together with corresponding mapping descriptions, and to map instances of exposed information model-elements to internal information model instances.

6. The computer system according to claim 3, wherein the model integration component is further configured to:
- detect a change in an instance space of the exposed information model;
- propagate the detected change to corresponding one or more internal objects of the internal information model based on registered classes represented in a type-space of the exposed information model; and/or
- detect a change among internal objects of the internal information model;
- propagate the detected change to corresponding one or more exposed objects in the instance space.

7. The computer system according to claim 1, wherein the model integration component is further configured to synchronize a content value, the content value being a non-primitive value related to a complex object comprising sub-objects, by recursively applying steps performing match-making and synchronizing to all sub-objects of the complex object.

8. A computer-implemented method for providing direct access to live values of application elements of an application at runtime to a consumer, the consumer being an external entity outside the computer system, by synchronizing, at application runtime, content values between an internal information model of the application and an exposed information model, the exposed information model being accessed by the consumer from outside the computer system, wherein internal information model-elements are mapped to exposed information model-elements via application code including mapping descriptions defining how the application data model is mapped to the exposed information model, the exposed information model comprising model-elements for exposing entity types representing devices in a network, and for exposing instances of types or classes and their member-values to the consumer, the exposed information model further configured for interaction with the consumer to browse the actual configuration of the application and make use of types or classes that are represented in the exposed information model to create instances in the exposed information model at application runtime, the method comprising:
- detecting a change of an exposed information model-element or an internal information element;
- determining a synchronization direction;
- performing match-making to determine a model-element corresponding to the changed model-element by using signatures of the corresponding information model-elements combined with the mapping description; and
- synchronizing the content value of the exposed information model-element and the corresponding internal information model-element in accordance with the determined synchronization direction to propagate the change between the exposed information model accessed by the consumer and the internal information model of the application at application runtime.

9. The method of claim 8, wherein the content value is a non-primitive value related to a complex object comprising sub-objects,
the method further comprising:
- recursively applying steps performing match-making and synchronizing the content value to all sub-objects of the complex object.

10. The method of claim 8, wherein determining a synchronization direction comprises:
- comparing timestamps associated with information model-elements to determine if a latest change occurred for an internal information model-element or for an exposed information model-element and using the information model with the latest change as an origin of the synchronization direction.

11. The method of claim 8, wherein determining a synchronization direction comprises:
- setting, when an information model server implementing the exposed information model detects the change, the exposed information model as an origin of the synchronization direction;
- setting, when an application component implementing the internal information model detects the change, the internal information model as an origin of the synchronization direction.

12. The method of claim 8, wherein performing match-making and synchronizing content value comprises:
- checking, when a change of a first exposed object is detected, if the first exposed object has an association, defined in the exposed information model, to a second exposed object, and, if there is an association, checking if the internal object that corresponds to the first exposed object matches a signature of a field of a second internal model-element that corresponds to the second exposed model-element, and if there is a signature match, setting a field value of the second internal model-element to the internal object;
- processing, when the change of a third internal object is detected, fields of the third internal object to determine one or more existing sub-objects of the third internal object, and checking if a third exposed object corresponding to the third internal object has an association, defined in the exposed information model, to a fourth exposed object corresponding to the one or more sub-objects, and if the association matches a signature or mapping description at a particular field of the third internal object, and in case of a missing association, creating a corresponding association in the exposed information model accordingly, and in case of an existing association but a missing sub-object at the particular field, removing the association.

13. A computer-implemented method for providing direct access to live values of application elements of an application at runtime to a consumer by synchronizing information model structures at application runtime, the consumer being an external entity accessing an exposed information model from outside the computer system, wherein internal information model-elements being mapped to exposed information model-elements via application code augmented with mapping descriptions define how the internal information model is mapped to the exposed information model, the exposed information model comprising model-elements for exposing entity types representing devices in a network, and for exposing instances of types or classes and their member-values to the consumer, the exposed information model further configured for interaction with the consumer to browse the actual configuration of the application and make use of types or classes that are represented in the exposed information model to create instances in the exposed information model at application runtime, the method comprising:
- detecting a model structure change in an instance space of the exposed information model;
- propagating the detected model structure change to corresponding one or more internal objects of the internal information model based on registered classes represented in a type-space of the exposed information model; or detecting a model structure change among internal objects of the internal information model;

propagating the detected model structure change to corresponding one or more exposed objects in the instance space at application runtime.

14. The method of claim 13, wherein:

if the detected model structure change is to create an internal object from a created new exposed object based on a certain type defined in a type-space of the exposed information model, determining a corresponding internal type/class and creating a new internal object of the corresponding type/class, and initializing fields of the new internal object with information coming from the respectively created new exposed object by applying a respective mapping description;

if the detected model structure change is to create an exposed object from a created new internal object of a certain internal type/class, determining a corresponding type in the exposed type-space and adding a new exposed object of the corresponding type to the instance space, and if the created new internal object is a complex object having one or more sub-objects, recursively processing a content of the created new internal object to create exposed model-elements for the one or more sub-objects;

if the detected model structure change is to remove an exposed object from the instance space, determining and removing the corresponding internal object;

if the detected model structure change is to remove an internal object from the internal information model, determining and removing the corresponding exposed object from the instance space, and if the removed internal object is a complex object having sub-objects, recursively processing the content of the removed internal object to identify and remove exposed objects that were created for the content of the complex exposed object.

15. A computer program product comprising instructions that when loaded into a memory of a computer system and being executed by at least one processor of the computer system cause the computer system to perform the method according to claim 8.

16. A computer program product comprising instructions that when loaded into a memory of a computer system and being executed by at least one processor of the computer system cause the computer system to perform the method according to claim 13.

* * * * *